United States Patent [19]
Nakajima et al.

[11] Patent Number: 5,842,061
[45] Date of Patent: Nov. 24, 1998

[54] APPARATUS USING BATTERY

[75] Inventors: Hidekazu Nakajima, Higashiosaka; Makoto Kato, Sakai, both of Japan

[73] Assignee: Minolta Co., Ltd., Osaka, Japan

[21] Appl. No.: 803,163

[22] Filed: Feb. 19, 1997

[30] Foreign Application Priority Data

Feb. 21, 1996 [JP] Japan ...................................... 8-033838

[51] Int. Cl.⁶ ............................ G03B 17/18; G08B 21/00
[52] U.S. Cl. ........................... 396/203; 396/277; 340/636
[58] Field of Search ................................ 396/279, 278, 396/277, 203, 205, 206, 301; 340/636

[56] References Cited

U.S. PATENT DOCUMENTS

| | | | |
|---|---|---|---|
| 5,500,710 | 3/1996 | Saito et al. | 396/277 |
| 5,610,525 | 3/1997 | Yoshida et al. | 396/636 |

Primary Examiner—W. B. Perkey
Attorney, Agent, or Firm—McDermott, Will & Emery

[57] ABSTRACT

When an operation such as the operation of the shutter release button or the closing of the cover to the film container compartment is performed, any operation such as charging that was underway is stopped once and checking of the battery voltage level is performed with reference to reference levels, wherein it is determined whether or not any such operation was underway when either of said operations was performed, and if any such operation was underway, that operation is stopped once, and the battery voltage level is checked with reference to reference levels that are reduced by a preset amount. Consequently, an accurate check of the battery voltage level may be performed with regard to the battery voltage that had fallen due to the carrying out of such operation but that is rising to the original voltage level due to that operation being stopped.

34 Claims, 8 Drawing Sheets

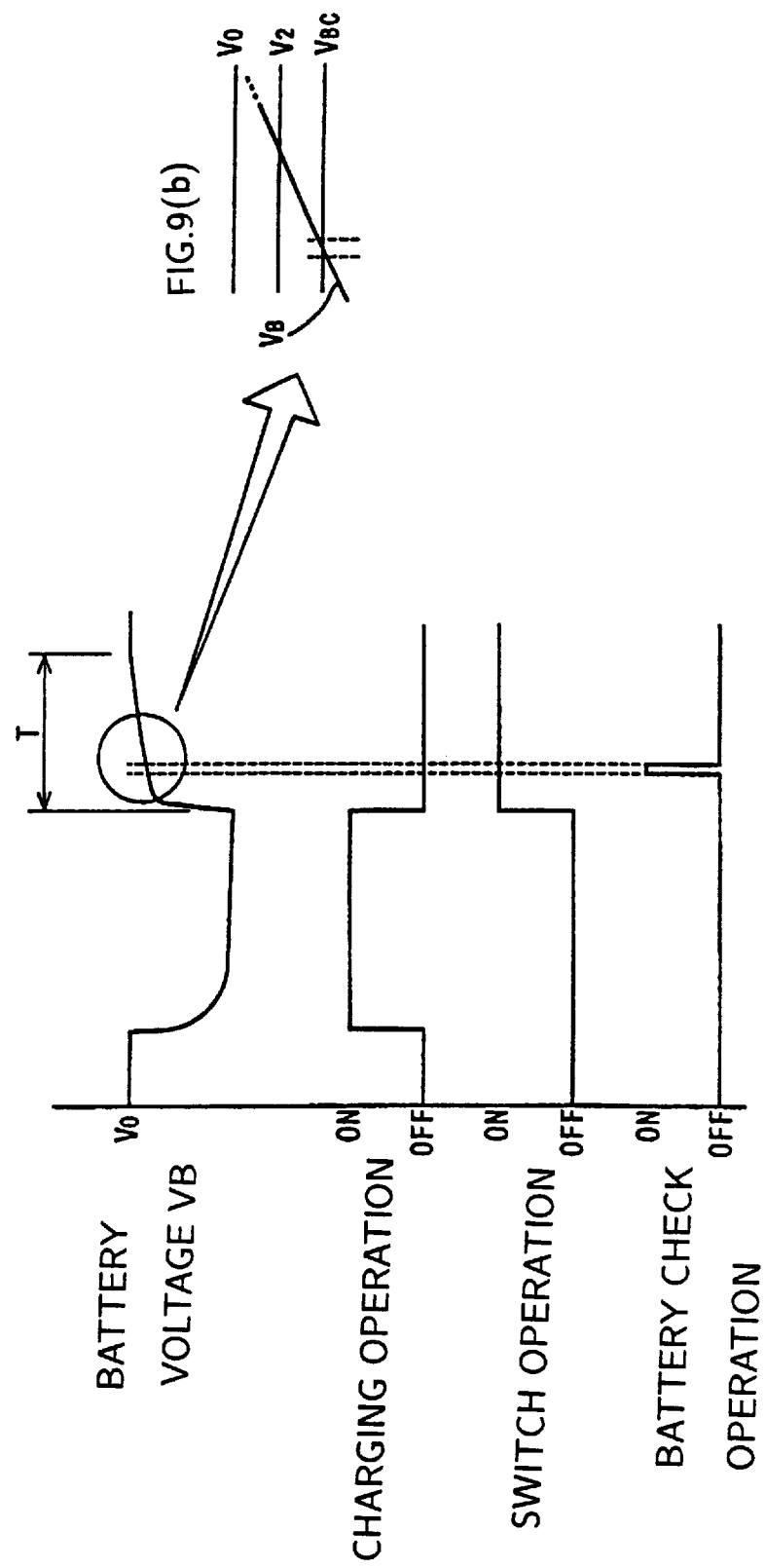

APPARATUS USING BATTERY

BACKGROUND OF THE INVENTION

1. Field of the Invention

The present invention pertains to an apparatus using a battery such as a camera, especially to an apparatus that performs checking of the battery voltage level.

2. Description of the Related Art

In a conventional apparatus using a battery such as a camera, when a particular switch is operated, the operation of the driven unit and the charging operation to the flash circuit is stopped once so that a battery check operation may be performed in which the battery voltage is detected and the voltage level is checked.

In this battery check operation, battery voltage VB is compared with preset lock voltage level V1 and warning voltage level V2 (V1<V2). Where V2<VB, a display is made to indicate full battery voltage, where V1<VB<V2, a warning display is activated, and where VB≦V1 a lock indicator is displayed and said charging operation is prohibited.

Incidentally, the battery voltage level decreases while current is being supplied to the driven unit. Due to the characteristics of the battery, even if the supply of current is stopped, the battery voltage level does not rise immediately, but gradually recovers to the original voltage level. In particular, during charging of the flash circuit condenser, because a strong current comprising several amperes is supplied from the battery to the condenser, the level of battery voltage VB decreases significantly.

Consequently, even where the charging operation is stopped, time T is required for battery voltage VB to recover to original voltage level V0, as shown in FIG. 9. FIG. 9 is a timing chart showing the status of various operations and the battery voltage level when a battery check is performed immediately after charging is stopped.

Therefore, when a particular switch is operated during charging to the flash circuit and the charging operation is stopped once to allow performance of battery check, battery voltage level VBC, which is lower than original voltage level V0, is detected. As a result, as shown in FIG. 9, the likelihood that voltage VBC will be detected as lower than warning voltage level V2 increases, and the warning display may be mistakenly activated even if there is sufficient remaining voltage.

Thus, in order to avoid this type of mistaken warning display, the idea of delaying the performance of battery check until the battery voltage level has recovered has been considered. However, because said recovery time T has recently tended to increase in keeping with reductions in the battery size implemented in order to permit a reduction in the size of the camera body, this solution is not desirable.

SUMMARY OF THE INVENTION

The object of the present invention is to provide an apparatus that solves the problems described above, and that can accurately determine, based on the supply of electric current such as charging of the flash circuit, the amount of remaining battery charge even immediately after the stopping of an operation.

In order to achieve said object, an apparatus of the present invention comprises a battery checker which detects the battery voltage supplied to the apparatus and compares the detected voltage with a prescribed reference value; an operation member; an operation performer which performs a prescribed operation of the apparatus; and a controller that performs control so that a battery check is performed by causing the battery checker to operate when said operation member is operated and changing said reference value and a battery check are performed if it is determined that the operation performer was performing an operation when said operation member was operated.

By means of said construction employed in the present invention, when an operation, for example a camera operation of the shutter release button or the closing of the cover to the film container compartment, is performed, a checking of the battery voltage level is performed with reference to reference level, wherein it is determined whether or not any such operation was underway when either of said operations was performed, and if any such operation was underway, the battery voltage level is checked with reference to reference level that are changed by a preset amount. Consequently, an accurate check of the battery voltage level may be performed with regard to the battery voltage that had fallen due to the carrying out of such operation but that is rising to the original voltage level.

In an alternate construction of an apparatus of the present invention, said apparatus comprises a battery checker that detects the battery voltage supplied to the apparatus and compares the detected voltage with a prescribed reference value; an operation member; an operation performer which performs a prescribed operation of the apparatus; and a controller that performs control so that the detected battery level is compared with first and second reference values by operating the battery checker when said operation member is operated, wherein if it is determined that said operation performer was performing an operation when said operation member was operated, said control causes the battery checker to operate in order to compare the detected battery level only with said first reference value.

BRIEF DESCRIPTION OF THE DRAWINGS

These and other objects and features of this invention will become clear from the following description, taken in conjunction with the preferred embodiments with reference to the accompanied drawings in which:

FIG. 6(*b*) is a drawing showing an example of the indicator display when it is determined that the battery voltage is at a warning voltage level;

FIG. 6(*c*) is a drawing showing an example of the indicator display when it is determined that the battery voltage is sufficient;

FIG. 9A is a timing chart showing the status of various operations and the battery voltage level when battery check is performed immediately after charging is stopped.

FIG. 9(B) is a detailed view of a portion of the battery voltage level as illustrated in the timing chart shown in FIG. 9(A).

DETAILED DESCRIPTION OF THE PREFERRED EMBODIMENTS

Figure 1:
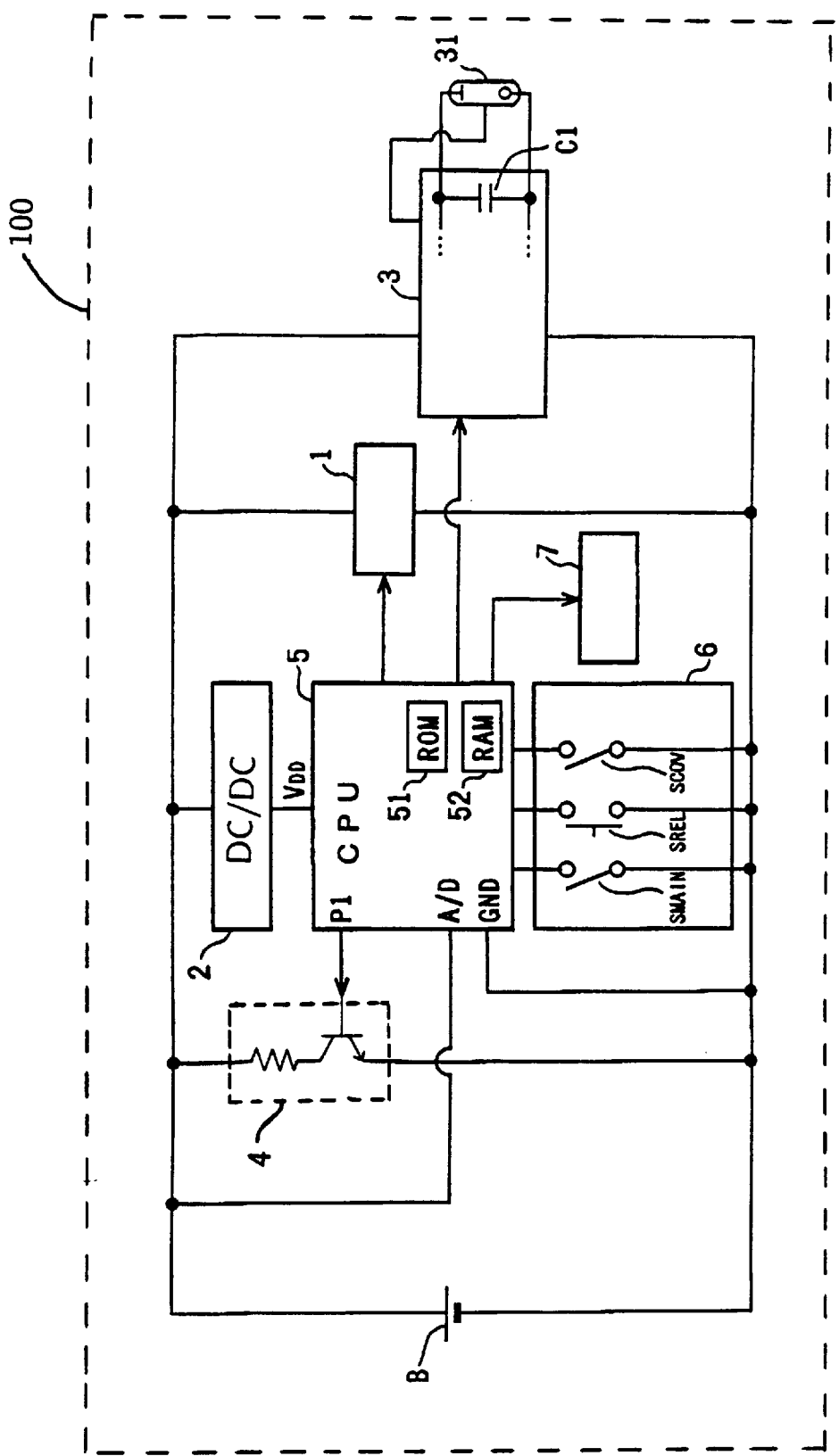
FIG. 1 is a block diagram showing the control system of a camera pertaining to an embodiment of the present invention.

FIG. 1 is a block diagram showing the circuit construction of a camera pertaining to a first embodiment of the present invention.

Camera 100 comprises driven unit 1, DC/DC converter 2, flash circuit 3, battery check circuit (BC circuit) 4, CPU 5, operation member 6 and display 7. Driven unit 1, flash circuit 3 and BC circuit 4 are each connected to and are supplied electrical current from battery B housed inside the camera body.

Driven unit 1 performs opening and closing of the shutter, zooming of the lens and feeding of the film, etc. DC/DC converter 2 converts battery voltage VB into constant voltage VDD of a required level and supplies it to CPU 5 and display 7 as a power supply. Flash circuit 3 has condenser C1, to both terminals of which is connected light source 31 comprising a xenon flash lamp, etc. and illuminates light source 31 by driving it to the ON position and discharging in an instant the accumulated charge after condenser C1 is charged.

BC circuit 4 comprises a series circuit in which switching elements that switch ON and OFF the driven unit and the supply of current to this driven unit are connected in series. In the example shown in the drawing, BC circuit 4 comprises a resistor and a transistor connected in series.

Figure 2:
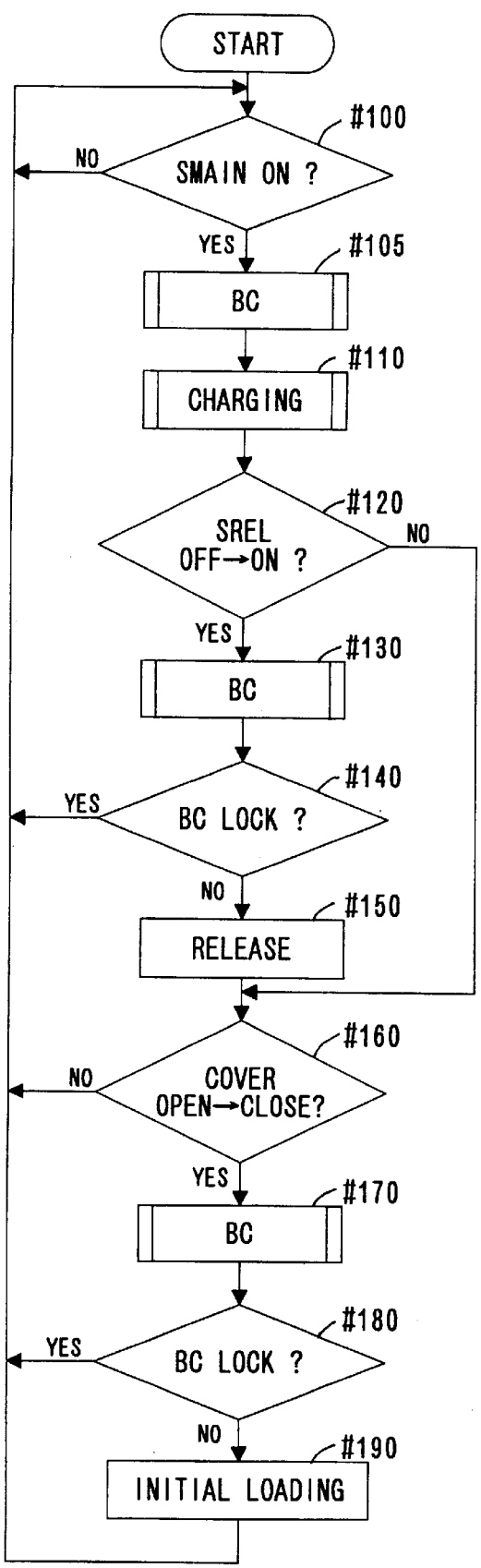
FIG. 2 is a flow chart showing the main routine.
Figure 3:
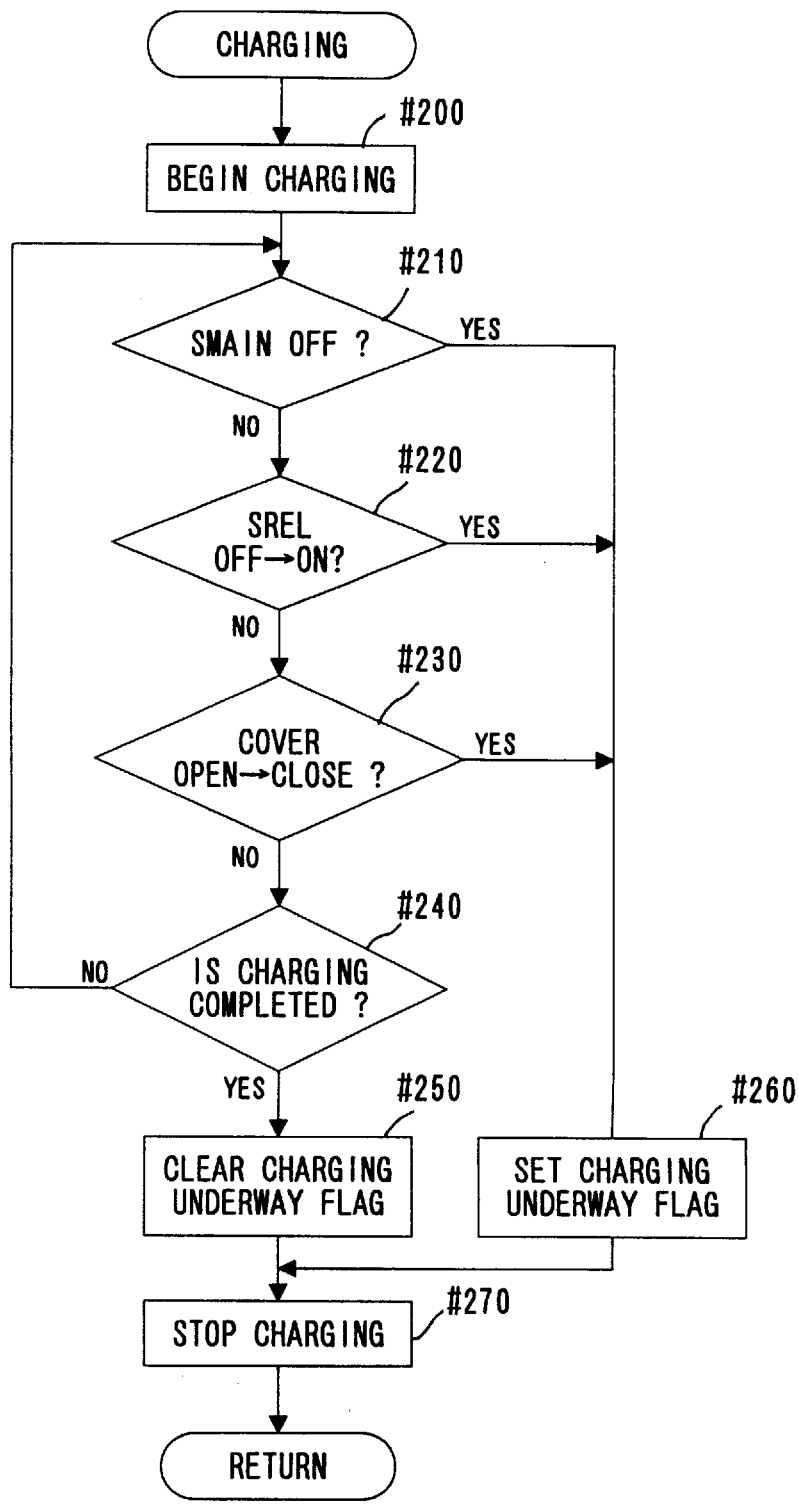
FIG. 3 is a flow chart showing the charging subroutine.
Figure 4:
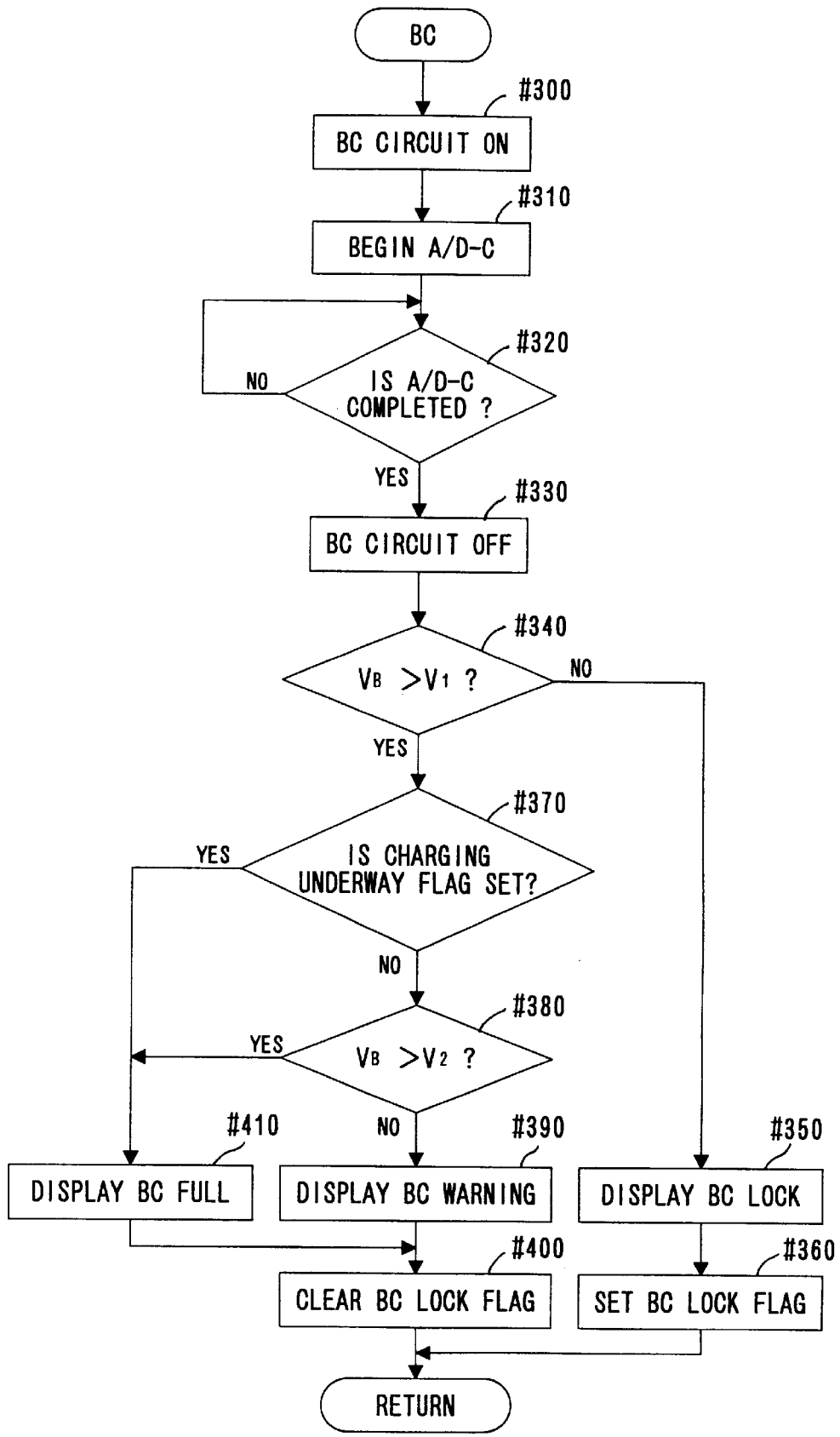
FIG. 4 is a flow chart showing the battery check subroutine in the first embodiment.

CPU 5 has ROM 51 and RAM 52, and controls the operations of this camera as shown in FIGS. 2 through 4 described below. ROM 51 memorizes preset data such as control programs and lock voltage level V1 (first reference level) and warning voltage level V2 (second reference level) described below. RAM 52 is used to temporarily save various types of data.

Operation member 6 which comprises main switch SMAIN, release switch SREL and cover switch SCOV, is, together with display 7, connected to CPU 5. Main switch SMAIN is used to permit or prohibit photo-taking. Release switch SREL is used to perform photo-taking. Cover switch SCOV detects whether the cover to the opening that houses the film container inside the camera body is open or closed, and is set to turn ON when the cover is open and to turn OFF when the cover is closed. Display 7 comprises an LCD panel mounted at an appropriate location on the surface of the camera body, and displays the result of a battery check using a symbol indicating a battery (hereinafter 'battery symbol') as described below as well as various types of data.

CPU 5 has the following functions (a) through (d) described below. (a) Performs operation control of the various components of driven unit 1 in response to the operation of operation member 6, and controls charging of condenser C1 of flash circuit 3 and illumination of light source 31.

(b) Performs ON/OFF control of the switching elements of BC circuit 4, to the control terminals of which is connected output terminal P1.

(c) Performs a battery check in accordance with a procedure described below in order to determine whether there is sufficient charge remaining in battery B to power said driven unit 1 or flash circuit 3 in response to the operation of operation member 6, before causing members requiring a large amount of current, such as driven unit 1 or flash circuit 3, to operate.

(d) Displays on display 7 the result of said battery check.

Next, the operations of the camera will be explained with reference to FIGS. 2 through 4.

FIG. 2 is a flow chart showing the main routine. When battery B is placed in the camera body, operation of CPU 5 is begun. After the performance of prescribed initialization processes such as the resetting of RAM 52 and the setting of default values, it is first determined whether main switch SMAIN is in the ON or OFF state (#100). If main switch SMAIN is in the OFF state (NO in #100), the camera enters a standby condition, while if it is in the ON state (YES in #100), the routine advances to the battery check (BC) subroutine described below (#105), and then advances to the charging subroutine described below (#110).

It is then determined whether release switch SREL has changed from the OFF state to the ON state (#120). If it has remained in the OFF state (NO in #120), the routine advances to step #160, while if release switch SREL has changed to the ON state (YES in #120), the routine advances to the BC subroutine described below (#130).

It is next determined whether or not the BC lock flag is set (#140). If it is set (YES in #140), the routine returns to step #100, while if the BC lock flag is not set (NO in #140), photo-taking operations such as light measurement, distance measurement, exposure and winding of the film by one frame are performed (#150).

It is then determined by means of a detection signal from cover switch SCOV whether or not the cover has moved from the open state to the closed state (#160). If the cover has stayed open (NO in #160), the routine returns to step #100, while if the cover has been closed (YES in #160), the routine advances to the BC subroutine described below (#170).

It is then determined whether or not the BC lock flag is set (#180). If it is set (YES in #180), the routine returns to step #100, while if the BC lock flag is not set (NO in #180), initial loading, in which the first frame of the film is fed forward to the photo-taking position, is performed, whereupon the routine returns to step #100.

FIG. 3 is a flow chart showing the charging subroutine of step #110 in FIG. 2.

Charging of condenser C1 of flash circuit 3 is first begun (#200), and it is then determined whether main switch SMAIN is in the ON or OFF state (#210). If main switch SMAIN is in the ON state (NO in #210), it is determined whether or not release switch SREL has moved from the OFF state to the ON state (#220). If release switch SREL is still in the OFF state (NO in #220), it is determined by means of a detection signal from cover switch SCOV whether or not the cover has moved from the open state to the closed state (#230).If the cover has stayed open (NO in #230), it is determined whether or not charging has been completed (#240).

If charging has not been completed (NO in #240), the routine returns to step #210 and the operations described above are repeated, while if charging is completed (YES in #240), the charging underway flag is cleared (#250) and charging is stopped (#270).

On the other hand, if it is determined that main switch SMAIN is in the OFF state in step #210 (YES in #210), that release switch SREL has moved to the ON state in step #220 (YES in #220), or that the cover has been closed in step #230 (YES in #230), the charging underway flag is set (#260) and the subroutine ends after the charging operation is stopped (#270).

As described above, because the charging underway flag is set when the charging operation is stopped, it may be determined whether or not the charging operation has been stopped.

FIG. 4 is a flow chart showing the BC subroutine of steps #105, #130 and #170 described above with reference to FIG. 2.

First, the switching element of BC circuit 4 is set to ON (#300), the output voltage of battery B is taken in, and A/D conversion is begun (#310) such that battery voltage VB may be detected with current being supplied to BC circuit 4. When A/D conversion is completed (YES in #320), the switching element of BC circuit 4 is set to OFF (#330), and detected battery voltage VB is then compared with lock voltage level V1 (#340).

Figure 6A:
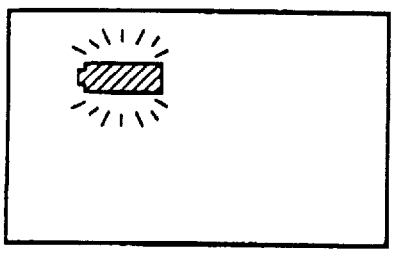
FIG. 6(*a*) is a drawing showing an example of the indicator display when it is determined that the battery voltage is lower than the lock voltage level.

If VB≦V1 (NO in #340), the BC lock display is activated (#350), causing the battery symbol to flash and extinguishing the display of all other indicators on display 7, as shown in FIG. 6(a), and the BC lock flag is set (#360).

On the other hand, if VB>V1 in step #340 (YES in #340), it is determined whether or not the charging underway flag is set (#370), and if it is not set (NO in #370), battery voltage VB is compared with warning voltage level V2 (V2>V1) (#380).

Figure 6B:
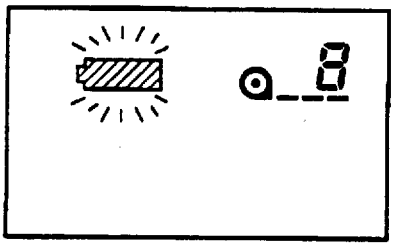

If VB≦V2 (NO in #380), the BC warning display is activated (#390), causing the battery symbol to flash on display 7, as shown in FIG. 6(b), the BC lock flag is cleared (#400), and the subroutine ends.

Where the warning display is activated, all other indicators are displayed normally. The film counter indicator is displayed here as an example.

Figure 6C:
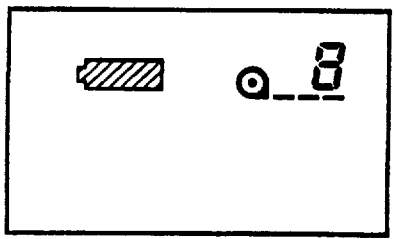

On the other hand, if it is determined that the charging underway flag is set in step #370 (YES in #370) or that VB>V2 in step #380 (YES in #380), the BC full display is activated (#410), causing the battery symbol as well as all other indicators to be displayed normally on display 7, as shown in FIG. 6(c), and the BC lock flag is cleared (#400).

Figure 5:
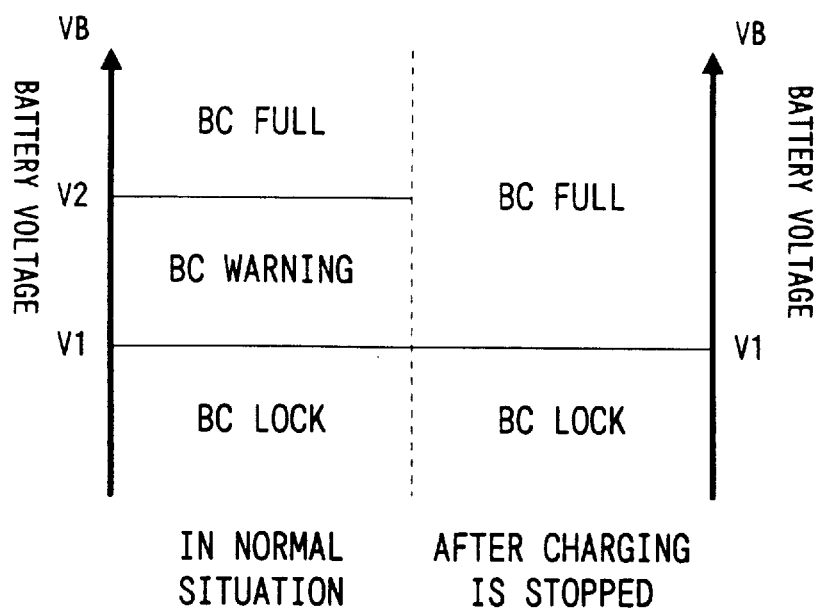
FIG. 5 is a drawing to explain the relationship between the battery voltage and the battery check process in the first embodiment.

The relationships between the battery voltage and the battery check processes in a normal situation and after charging is stopped are shown in FIG. 5 with regard to the embodiment described above.

As shown in the drawing, because a comparison between battery voltage VB and warning voltage level V2 is not performed in a battery check performed immediately after charging is stopped, activation of the warning display may be prevented when there is sufficient charge remaining in the battery.

In said first embodiment, only in the battery check performed immediately after charging is stopped is the comparison between battery voltage VB and warning voltage level V2 not performed. However, the present invention is not limited to this, and said non-performance may also occur in a battery check performed immediately after the ceasing of the operation of a driven unit 1 member that requires a relatively stronger current.

A member of driven unit 1 or display 7 that requires a relatively small current and does not negatively affect the camera operations may be used as BC circuit 4, eliminating the need for a separate BC circuit 4.

A second embodiment pertaining to the present invention will now be explained.

A camera of the second embodiment has the same construction as first embodiment described above. It differs, however, in that the lock voltage level and warning voltage level that are compared with battery voltage VB in an ordinary battery check are changed from those levels used in a battery check performed immediately after charging is stopped. In other words, in an ordinary battery check, battery voltage VB is compared with first lock voltage level V1 and first warning voltage level V2, while in a battery check performed immediately after charging is stopped, battery voltage VB is compared with second lock voltage level V11 and second warning voltage level V12.

Figure 7:
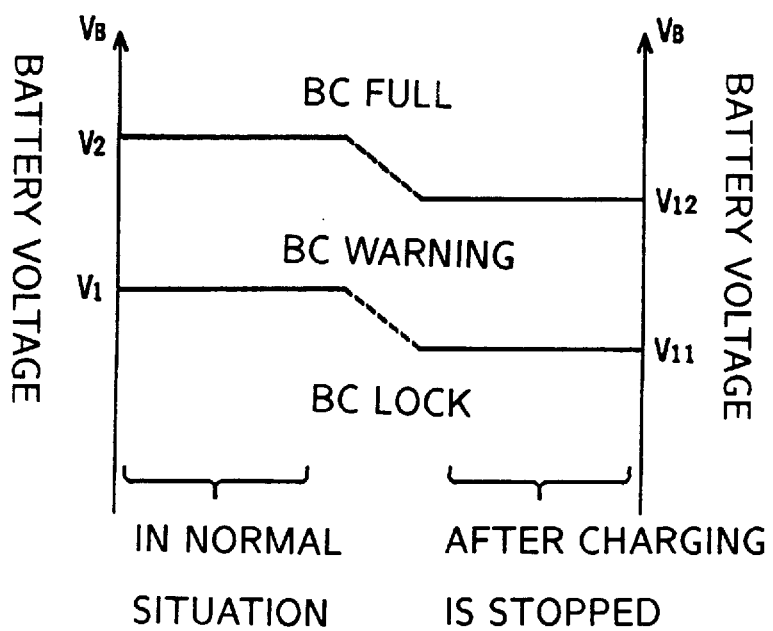
FIG. 7 is a drawing to explain changing of the lock voltage level and the warning voltage level in the second embodiment.

The second lock voltage level V11 and second warning voltage level V12 are set beforehand such that V1>V11 and V2>V12, as shown in FIG. 7, and are stored in ROM 51. These differences in lock voltage level (V1−V11) and warning voltage level (V2−V12) are set based on such characteristics of battery B as the recovery curve for battery voltage VB immediately after charging is stopped.

Figure 8:
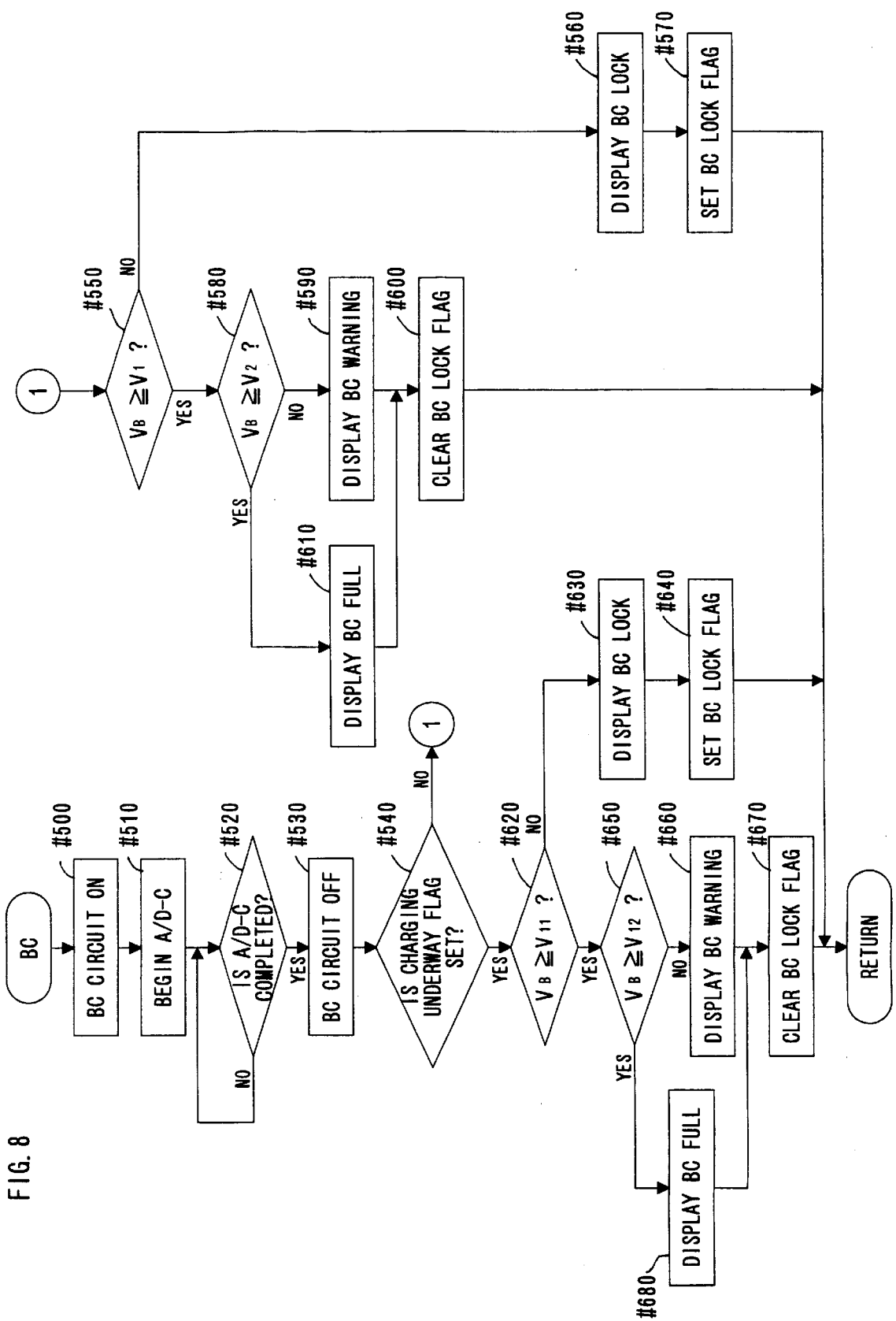
FIG. 8 is a flow chart showing the battery check subroutine in the second embodiment.

FIG. 8 is a flow chart showing the B, C subroutine of the second embodiment. Since steps #500 through #530 are the same as steps #300 through #330 in FIG. 4, their explanation will be omitted here.

Continuing from step #530, it is determined whether or not the charging underway flag is set (#540), and if it is not set (NO in #540), battery voltage VB is compared with first lock voltage level V1 (#550). If VB<V1 (NO in #550), the BC lock display shown in FIG. 6(a) is activated (#560) and the BC lock flag is set (#570).

On the other hand, if VB≧V1 in step #550 (YES in #550), battery voltage VB is compared with first warning voltage level V2 (#580). If VB<V2 (NO in #580), the BC warning display shown in FIG. 6(b) is activated (#590) and the BC lock flag is cleared (#600).

If VB≧V2 (YES in #580), the BC full display shown in FIG. 6(c) is activated (#610) and the BC lock flag is cleared (#600).

Conversely, if the charging underway flag is set in step #540 (YES in #540), battery voltage VB is compared with second lock voltage level V11 (#620). If VB<V11 (NO in #620), the BC lock display shown in FIG. 6(a) is activated (#630) and the BC lock flag is set (#640).

On the other hand, if VB≧V11 in step #620 (YES in #620), battery voltage VB is compared with second warning voltage level V12 (#650). If VB<V12 (NO in #650), the BC warning display shown in FIG. 6(b) is activated (#660) and the BC lock flag is cleared (#670).

If VB≧V12 (YES in #650), the BC full display shown in FIG. 6(c) is activated (#680) and the BC lock flag is cleared (#670).

As described above, because in a battery check performed immediately after charging is stopped the lock voltage level and warning voltage level that are compared with battery voltage VB are lower than in an ordinary battery check, an accurate battery check, that is appropriate for battery voltage VB that is rising to the original voltage level from the level that it had fallen due to charging, may be performed.

In the second embodiment described above, the lock voltage level and warning voltage level that are compared with battery voltage VB are lowered only in a battery check performed immediately after charging is stopped. The present invention is not limited to this, however, and said levels may also be lowered in a battery check performed immediately after the ceasing of the operation of a member of driven unit 1 that requires a relatively strong current.

Further in said second embodiment, while both the lock voltage level and warning voltage level that are compared with battery voltage VB are lowered, it is also acceptable if only one of said levels is lowered.

What is claimed is:

1. An apparatus using a battery, comprising:
    a battery checker which detects the battery voltage supplied to the apparatus and compares the detected voltage with a prescribed reference value;
    an operation member;
    an operation performer which performs a prescribed operation of the apparatus; and
    a controller that performs control so that a battery check is performed by causing the battery checker to operate when said operation member is operated and changing said reference value and a battery check are performed if it is determined that the operation performer was performing an operation when said operation member was operated, wherein if it is determined that said operation performer was performing an operation when said operation member was operated, changing said reference value and a battery check are performed.

2. An apparatus as claimed in claim 1, further comprising a display device which is operated in accordance with said comparison by said battery checker.

3. An apparatus as claimed in claim 1, wherein said prescribed reference value includes two different values.

4. An apparatus as claimed in claim 3, wherein said controller changes only one of said two different values.

5. An apparatus as claimed in claim 4, wherein said controller changes said reference value into a lower value.

6. An apparatus as claimed in claim 1, wherein said apparatus includes a camera.

7. An apparatus as claimed in claim 6, further comprising a display device which is operated in accordance with said comparison by said battery checker.

8. An apparatus as claimed in claim 6, wherein said prescribed operation of the apparatus includes a charging of a flash device.

9. An apparatus as claimed in claim 6, wherein said prescribed reference value includes two different values.

10. An apparatus as claimed in claim 9, wherein said controller changes only one of said two different values.

11. An apparatus as claimed in claim 10, wherein said controller changes said reference value into a lower value.

12. An apparatus as claimed in claim 1, wherein said prescribed operation of the apparatus includes a charging of a flash device.

13. An apparatus as claimed in claim 1, further comprising a battery.

14. An apparatus using a battery, comprising:
    a battery checker which detects the battery voltage supplied to the apparatus and compares the detected voltage with a prescribed reference value;
    an operation member;
    an operation performer which performs a prescribed operation of the apparatus; and
    a controller that performs control so that a battery check is performed by causing the battery checker to operate when said operation member is operated and changing said reference value and a battery check are performed if it is determined that the operation performer was performing an operation when said operation member was operated, wherein if it is determined that said operation performer was performing an operation when said operation member was operated, changing said reference value and a battery check are performed after stopping said operation.

15. An apparatus using a battery, comprising:
    a battery checker which detects the battery voltage supplied to the apparatus and compares the detected voltage with a prescribed reference value;
    an operation member;
    an operation performer which performs a prescribed operation of the apparatus; and
    a controller that performs control so that the detected battery level is compared with first and second reference values by operating the battery checker when said operation member is operated, wherein if it is determined that said operation performer was performing an operation when said operation member was operated, said control causes the battery checker to operate in order to compare the detected battery level only with said first reference value, wherein if it is determined that said operation performer was performing an operation when said operation member was operated, said controller causes the battery checker to operate in order to compare the detected battery level only with said first reference value.

16. An apparatus as claimed in claim 15, further comprising a display device which is operated in accordance with said comparison by said battery checker.

17. An apparatus as claimed in claim 15, wherein said apparatus includes a camera.

18. An apparatus as claimed in claim 17, wherein said prescribed operation of the apparatus includes a charging of a flash device.

19. An apparatus as claimed in claim 17, wherein said first reference value is lower than said second reference value.

20. An apparatus as claimed in claim 17, further comprising a display device which is operated in accordance with said comparison by said battery checker.

21. An apparatus as claimed in claim 15, wherein said prescribed operation of the apparatus includes a charging of a flash device.

22. An apparatus as claimed in claim 15, further comprising a battery.

23. An apparatus as claimed in claim 15, wherein said first reference value is lower than said second reference value.

24. An apparatus using a battery, comprising:
    a battery checker which detects the battery voltage supplied to the apparatus and compares the detected voltage with a prescribed reference value;
    an operation member;
    an operation performer which performs a prescribed operation of the apparatus; and
    a controller that performs control so that the detected battery level is compared with first and second reference values by operating the battery checker when said operation member is operated, wherein if it is determined that said operation performer was performing an operation when said operation member was operated, said control causes the battery checker to operate in order to compare the detected battery level only with said first reference value, wherein if it is determined that said operation performer was performing an operation when said operation member was operated, said controller, after stopping said operation, causes the battery checker to operate in order to compare the detected battery level only with said first reference value.

25. An apparatus using a battery, comprising:
    a battery checker which detects the battery voltage supplied to the apparatus and compares the detected voltage with a prescribed reference value;
    an operation member;
    an operation performer which performs a prescribed operation of the apparatus;

a controller that performs control so that a battery check is performed in a manner in accordance with a result of said comparison; and a determiner which determines whether the operation performer was performing an operation when said operation member was operated, wherein said controller controls said battery checker to operate according to the results from said determiner.

26. An apparatus as claimed in claim 25, further comprising a display device which is operated in accordance with said comparison by said battery checker.

27. An apparatus as claimed in claim 25, wherein said apparatus includes a camera.

28. An apparatus as claimed in claim 25, wherein said prescribed operation of the apparatus includes a charging of a flash device.

29. An apparatus as claimed in claim 25, further comprising a battery.

30. An apparatus as claimed in claim 25, wherein said controller changes said prescribed reference value in accordance with a result by said determiner.

31. A method for checking a battery voltage, comprising the following steps of:

a step of detecting that an operation member is operated;

a step of determining whether a prescribed operation is underway when said operation member is operated;

a step of activating a battery check in a first manner when said prescribed operation is not underway and in a second manner when said prescribed operation is underway.

32. A method for checking a battery voltage as claimed in claim 31, wherein said battery check is operated by comparing a detected battery voltage with a prescribed reference value.

33. A method for checking a battery voltage as claimed in claim 32, wherein said prescribed reference value is different between a value in said first manner and a value in said second manner.

34. An apparatus using a battery, comprising:

a battery checker which detects the battery voltage supplied to the apparatus and compares the detected voltage with a prescribed reference value;

an operation member;

an operation performer which performs a prescribed operation of the apparatus; and a controller that performs control so that a battery check is performed by causing the battery checker to operate when said operation member is operated and changing said reference value and a battery check are performed if it is determined that the operation performer was performing an operation when said operation member was operated, wherein if it is determined that said operation performer was performing an operation when said operation member was operated, changing said reference value and a battery check are performed after stopping said operation and prior to the termination of a recovery period, wherein said recovery period begins immediately after said operation performer stops operating and ends after the battery voltage rises to a substantially levelized voltage.

* * * * *